United States Patent [19]
Sher et al.

[11] Patent Number: 5,914,898
[45] Date of Patent: Jun. 22, 1999

[54] MEMORY DEVICE AND SYSTEM WITH LEAKAGE BLOCKING CIRCUITRY

[75] Inventors: Joseph Sher, Meridian; Dan Loughmiller, Boise, both of Id.

[73] Assignee: Micron Technology, Inc., Boise, Id.

[21] Appl. No.: 08/906,568

[22] Filed: Aug. 5, 1997

[51] Int. Cl.[6] .................................................. G11C 7/00
[52] U.S. Cl. ............................ 365/189.05; 365/189.09; 326/27; 326/83
[58] Field of Search .................... 365/189.11, 189.05, 365/189.09; 326/82, 83, 26, 27, 56, 57, 58; 327/108, 109

[56] References Cited

U.S. PATENT DOCUMENTS

| | | | |
|---|---|---|---|
| 5,274,276 | 12/1993 | Casper et al. | 307/443 |
| 5,369,317 | 11/1994 | Casper et al. | 326/87 |
| 5,513,140 | 4/1996 | Merritt | 365/189.05 |
| 5,559,452 | 9/1996 | Saito | 326/88 |
| 5,587,671 | 12/1996 | Zagar et al. | 326/83 |
| 5,602,783 | 2/1997 | Ong | 365/189.05 |

*Primary Examiner*—David Nelms
*Assistant Examiner*—Son Mai
*Attorney, Agent, or Firm*—W. Eric Webostad

[57] ABSTRACT

A method and apparatus for applying a blocking potential for gating inputs of pull-up and pull-down devices of an output driver is described. The blocking potential is applied to either or both of a pull-up or pull-down transistor for reducing leakage current. In particular, a circuit having a voltage generator for producing the blocking polarity potential is connected to a voltage translator. A control signal is provided to the voltage translator for accessing the output driver. During accessing of the output driver, the blocking polarity potential is isolated from gating inputs of the pull-up and pull-down devices of the output driver. In a memory device employing the output driver, the blocking polarity potential is applied when the memory is in a state which does not activate the output driver. The blocking polarity is provided by a voltage divider using a substrate bias potential. A feedback path is employed to follow voltage applied to an output pad through substrate bias voltage.

7 Claims, 7 Drawing Sheets

5,914,898

MEMORY DEVICE AND SYSTEM WITH LEAKAGE BLOCKING CIRCUITRY

TECHNICAL FIELD OF THE INVENTION

This invention relates generally to transistor leakage current, and more particularly relates to reduction of transistor leakage current in an output driver of a memory device.

BACKGROUND OF THE INVENTION

A memory device stores digital data in an array of memory cells. In order to read information from such an array, a cell is sensed for the presence or absence of charge. That information is amplified and transferred out of the memory device. Typically, an output driver coupled to or part of an output buffer is used to transfer the information out of the memory device.

One typical circuit arrangement for an output driver is a push-pull circuit. In such a circuit, a pull-up transistor is connected serially to a pull-down transistor between two potentials. The location in which the two transistors are connected, such as between drain of one and source of the other, typically provides a connection to an input/output pad (DQ pad).

To drive a logic high level output, a pull-up transistor is activated and a pull-down transistor is deactivated. As the pull-up transistor has its source connected to a logic high level, such as $V_{cc}$, the DQ pad is driven toward the logic high level. When a logic low level is to be outputted, the pull-down transistor is activated and the pull-up transistor is deactivated. By activating the pull-down transistor, the DQ pad is coupled to a logic low level, such as ground or $V_{ss}$, to provide a logic low level output.

A problem arises when either or both pull-up or pull-down transistor conduct at a subvoltage threshold level. For example, if N-channel transistors are used, a zero voltage or even slightly negative voltage on the gates of pull-up or pull-down devices may cause pull-up and/or pull-down N-channel devices to have a greater than allowable sub-threshold leakage current. This problem is exacerbated by the very large pull-up and pull-down devices, which more readily draw current.

One attempt to address this leakage current problem was to couple an additional transistor to the pull-up transistor. The additional transistor had its source connected to the gate of the pull-up transistor, and the drain of the additional transistor was connected to the junction between the pull-up and pull-down transistors. The gate of the additional transistor was connected to ground. If the additional transistor was made with a lower threshold voltage than the pull-up transistor, it would turn on prior to the pull-up transistor. Therefore, if the DQ pad was driven to a negative voltage level, the additional transistor could prevent the pull-up transistor from turning on. However, the additional transistor does not sufficiently prevent leakage current from $V_{cc}$ through the pull-up transistor to the DQ pad.

Another problem arises when a DQ pad is driven to a negative voltage level. For example, if the negative voltage on the DQ pad is more negative than the substrate bias voltage, such that the difference between the voltages is equal to or in excess of a threshold voltage of the diode (barrier potential across a depletion layer of a diode), then the diode will conduct current. This leakage current is not desirable.

Therefore, it would be desirable to provide apparatus and methods for protecting against leakage current from $V_{cc}$ or ground to the DQ, or alternatively stated, across pull-up and/or pull-down devices. In particular, it would be desirable to provide apparatus and methods for reducing or preventing leakage current when the DQ pad is driven to a potential such that a leakage current exists.

SUMMARY OF THE INVENTION

The present invention includes applying an blocking polarity potential for gating inputs of pull-up and pull-down transistors of an output driver. By blocking polarity, it is meant a polarity which is less likely to turn on an associated access device, such as a transistor. In particular, gates of pull-up and pull-down transistors are gated by an blocking polarity voltage during a time of output driver deactivation, such as write and standby operations of a memory device. This blocking polarity gating is employed to reduce current leakage. Such leakage current may be reduced to the point of elimination. In particular, to avoid unwanted operation of a transistor at a subthreshold voltage level, a voltage is applied to the gate of the transistor to reduce such unwanted operation.

In particular, the present invention provides a circuit having a voltage generator for producing a blocking polarity voltage. The blocking polarity potential is received by a voltage translator or controller. Additionally, a control signal is provided to the voltage translator. The voltage translator is employed for applying the blocking polarity voltage to an output driver at desired times, as is indicated by the control signal. For example, when the control signal is active, a blocking polarity potential may be applied to the output driver to protect against leakage currents. In the case of an N-channel device in the output driver, the blocking polarity potential is a negative voltage applied to the gate of the transistor. In the case of a P-channel device in the output driver, the blocking polarity potential is a positive potential applied to the gate. It should be understood that positive and negative are relative terms in reference to bias voltage applied to a source of an N-channel or P-channel device. Preferably, pull-up and pull-down portions of an output driver are each N-channel transistors; however, it should be understood in accordance with the present invention that P-channel transistors may be employed as well.

A memory device in accordance with the present invention includes a read path coupled to a memory output node. The output node may be a DQ pad. The read path includes an output driver. The output driver receives a voltage for protecting against leakage current when the read path is idle or not employed. The read path will be employed when information is to be read from a memory array; otherwise, it is idle.

The present invention further provides a voltage feedback path which allows substrate bias voltage to be directed toward an output driver, when an output pad voltage exceeds a barrier potential of a diode interposed in a substrate member of a pull-up or pull-down device and a DQ pad. When such a diode barrier potential is overcome, causing the diode to conduct, the feedback path pulls substrate bias voltage in the direction of the potential level of the output pad. For N-type pull-up or pull-down devices, (for example, when a DQ is pulled to a negative potential) substrate potential will become more negative. This substrate current flowing across an inherent diode formed by a portion of a pull-up or pull-down transistor may then be fed back to a voltage divider. As the voltage divider is referenced to the substrate, voltage provided by the divider to be delivered to gates of the pull-up and/or pull-down devices is lowered (becomes more negative). By applying such a gating voltage to pull-up or pull-down devices connected to an output node, leakage current across a channel of a transistor is reduced.

BRIEF DESCRIPTION OF THE DRAWINGS

The features and advantages of the present invention will be more readily understood and appreciated by reference to the appended claims, detailed description of particular embodiments and accompanying drawings where:

Figure 1:
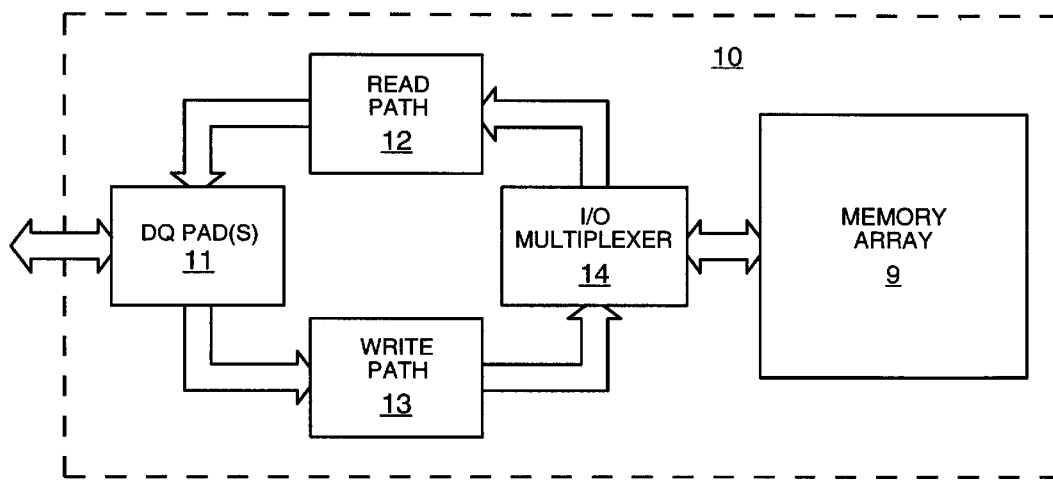
FIG. 1 is a block diagram of a portion of an exemplary memory which may incorporate the present invention.

Reference numbers refer to the same or equivalent parts of embodiment(s) of the present invention throughout the several figures of the drawing.

DETAILED DESCRIPTION OF THE PREFERRED EMBODIMENTS

Referring to FIG. 1, there is shown a block diagram of an exemplary portion of a memory device 10 which may incorporate the present invention. Memory device 10 includes memory array 9, DQ pad(s) 11, read path 12, write path 13, and I/O multiplexer 14. It should be understood that DQ pad(s) 11 may include one or more input/output I/O multiplexers 14. Memory device 10 may be a Dynamic Random Access Memory ("DRAM").

Figure 2:
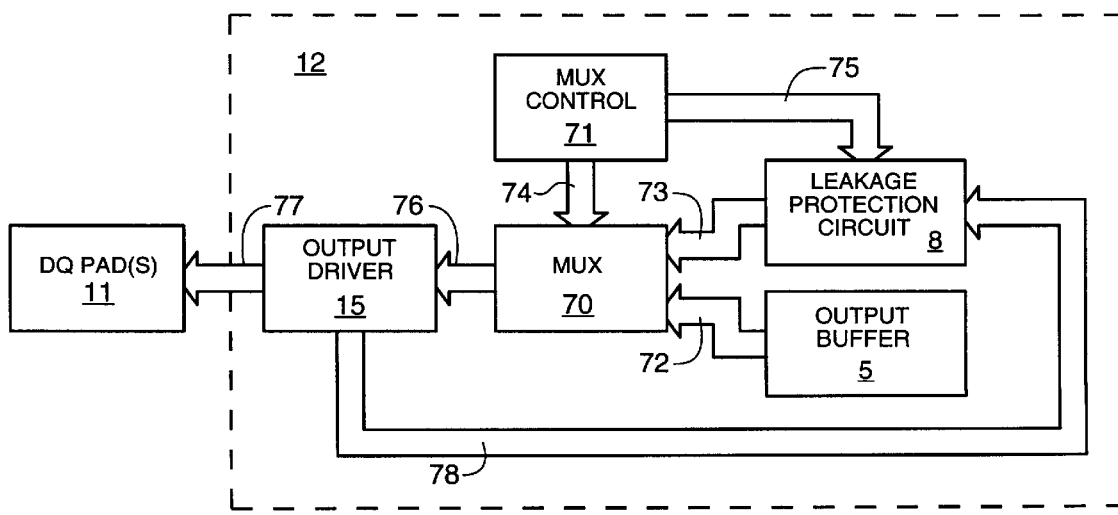
FIG. 2 is a block diagram of an exemplary portion of a read path in accordance with the present invention.

Referring now to FIG. 2, there is shown a block diagram of an exemplary portion of read path 12 in accordance with the present invention. Leakage protection circuit 8 is coupled to multiplexer (MUX) 70. Also coupled to MUX 70 are MUX control 71, output buffer 5, and output driver 15. Output driver 15 is coupled to DQ pad(s) 11. While leakage protection circuit 8 is described as incorporated in read path 12 of memory 10, it should be understood that leakage protection circuit 8 may be incorporated into integrated circuits, other than memories, with an output driver.

Read path 12, excluding leakage protection circuit 8, is active during read operations and inactive during write operations and standby times. During a read operation, output buffer 5 is active. Output from output buffer 5 is provided to MUX 70 via path 72. MUX control 71 selects input from path 72 over that of path 73 from circuit 8. MUX control 71 provides such select signals via path 74. Via path 75, MUX control 71 may provide a signal (such as, signal 44 or 47 shown in FIG. 4) to electrically isolate circuit 8 from MUX 70. Output from buffer 5 then passes through MUX 70 along path 76 to output driver 15 for outputting to DQ pad 11 via path 77.

If read path 12 is inactive, output from leakage protection circuit 8 along path 73 is selected for MUX 70 over any input from path 72. MUX control 71 provides select signals to MUX 70 along path 74 for such selection. Moreover, MUX 71 may also provide a signal (such as signal 44 or 47 shown in FIG. 4) along path 75 to circuit 8 to remove any electrical isolation of circuit 8 from MUX 70. Output from circuit 8 is thus provided through MUX 70 to output driver 15 via path 76. Such output is to reduce or prevent leakage current in output driver 15, as is explained in more detail elsewhere herein. Moreover, a feedback path from DQ pad 11 and output driver 15 to circuit 8 via paths 77, 78 may be provided as illustratively shown in FIG. 2. Such feedback path is for further reducing to preventing such leakage current, as is explained in more detail elsewhere herein.

Figure 3:
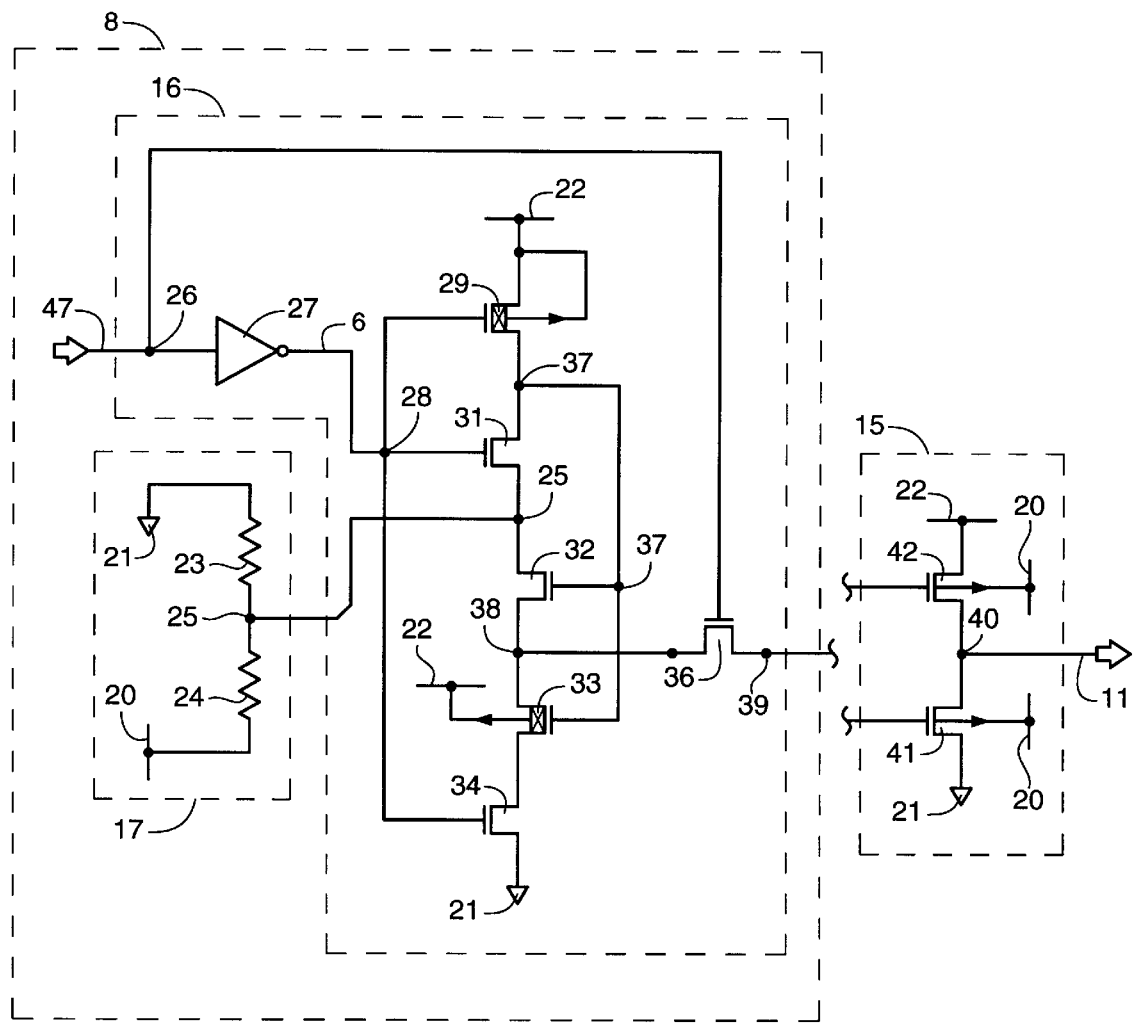
FIG. 3 is a schematic diagram of an embodiment of a leakage protection circuit in accordance with the present invention.

Referring to FIG. 3, there is shown a schematic diagram of an embodiment of leakage protection (blocking) circuit 8 in accordance with an embodiment of the present invention. Output driver 15 is shown as having a pull-up transistor 42 and a pull-down transistor 41. Transistors 41, 42 are shown as N-channel devices. However, it will be appreciated by one of ordinary skill in the art that P-channel devices may be employed in accordance with the principles of the present invention.

A source/drain region of transistor 42 is coupled to a high logic level voltage, such as $V_{cc}$ 22. $V_{cc}$ 22 is a supply potential. Typically such supply potentials are approximately either 5 or 3.3 volts, although other values may be used. Transistors 41,42 have biased substrates (shown in FIG. 5), which are biased by a voltage $V_{bb}$ 20. A source/drain region of transistor 41 is connected to a low logic level voltage, such as common ground 21. While ground potential, namely, zero volts, is employed, it should be understood that other lower logic level voltages may be used. Other source/drain regions of transistor 42 and of transistor 41 are connected at node 40.

Node 40 is connected to at least one DQ pad 11. It should be understood that node 40 may be shared by write path 13 (shown in FIG. 1) and read path 12 (shown in FIG. 1). Gates or access terminals of transistors 41, 42 are connected to MUX 70 (shown in FIG. 6). Operation of circuit 8 and driver 15 with MUX 70 is explained in more detail with reference to FIG. 6. Node 39 is connected to a source/drain region of transistor 36 of negative voltage translator 16. Transistor 36 acts as a pass device for applying a negative voltage to node 39 when control signal 47 is active. A negative voltage is employed for N-channel devices. However, a positive potential may be used if P-channel devices are employed.

Figure 4:
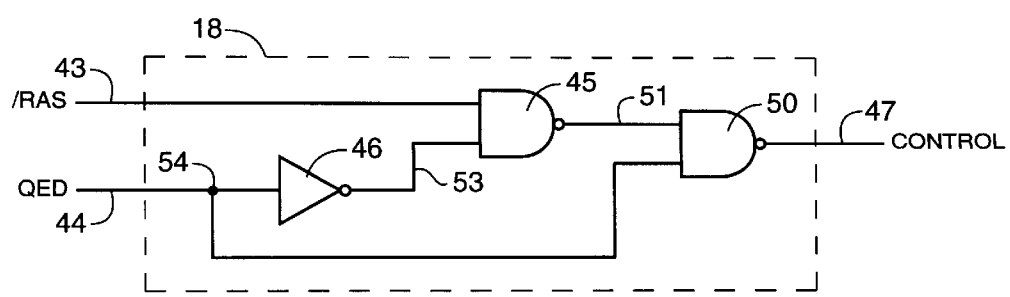
FIG. 4 is a schematic diagram of a control path in accordance with the present invention.

Control signal 47 may be supplied by control path 18, a schematic diagram of which is shown in FIG. 4 in accordance with an embodiment of the present invention. With continuing reference to FIG. 3 in combination with FIG. 4, operation of control path 18 and control signal 47 is described. QED signal 44 is an output enable signal. QED signal 44 may be supplied by MUX control 71 (shown in FIG. 2). QED signal 44 is active high. When an output is to be provided from driver 15, QED signal 44 is high or active. Row-address-strobe (/RAS) signal 43 is a known signal for DRAM operation. /RAS signal 43 is active low. /RAS signal 43 is high or inactive during standby mode. When in standby mode, /RAS signal 43 will be high as applied to NAND gate 45, and QED signal 44 will be low from node 54 as applied to inverter 46 and NAND gate 50. Consequently, output signal 53 from inverter 46 will be high. As /RAS signal 43 and output signal 53 are both high for standby mode, output signal 51 of NAND gate 45 will be low. As QED signal 44 and output signal 51 are low in standby mode, control signal 47 of NAND gate 50 will be high. As control signal 47 is active high, transistor 36 is turned on to apply voltage at node 38 to node 39. In other words, an active control signal 47 turns on an isolation device to allow a potential to be conducted from one location to another location. Negative voltage at node 38 is obtained from a negative voltage appearing at node 25 for application to gates of pull-up and pull-down transistors 42 and 41, as is explained in more detail elsewhere herein.

In addition to standby mode, because the present invention is directed to read path 12 (shown in FIG. 1), a negative voltage may be applied to node 39 during a write operation of memory device 10. This is particularly important when a DQ pad 11 (shown in FIG. 1) is shared by write path 13 and read path 12 (both of which are shown in FIG. 1). For a write operation, /RAS signal 43 will be low (active). However, QED signal 44 will be low too, as output driver 15 is not activated for write operations. Consequently, output signal 53 of inverter 46 will be high. With /RAS signal 43 low and signal 53 high, output signal 51 from NAND gate 45 will be high. With QED signal 44 low and output signal 51 high, as applied to NAND gate 50, control signal 47 will be high. In other words, when in write mode, control signal 47 is active.

If a read operation is to take place, /RAS signal 43 goes low and QED signal 44 goes high. This results in two high inputs, namely, QED signal 44 and output 51, to NAND gate 50. Hence, control signal 47 from NAND gate 50 is low. In other words, control signal 47 is inactive during a read operation.

Notably, control path 18 may form part of MUX control 71 (shown in FIG. 2). Also, it should be understood that there are many ways of providing QED signal 44 depending upon the types of inputs to memory 10 (shown in FIG. 1). For example, if output and write enable signals are provided, QED signal 44 may be provided based on a logical combination thereof.

With continuing reference to FIG. 3, voltage generator 17 supplies a determined voltage level as a current leakage blocking polarity potential (voltage). For the embodiment shown, a negative voltage is provided. While any negative voltage will help a subthreshold voltage leakage situation for the embodiment shown, a negative voltage in a range between zero volts and $V_{bb}$ (substrate bias voltage) is preferred, where $V_{bb}$ is a negative substrate bias voltage for an N-channel device. A voltage in such a range will draw less current and provide faster switching time for a DQ driver when compared to using $V_{bb}$. It should be appreciated that because leakage current increases exponentially with increasing gate voltage, a negative voltage of even a few hundred millivolts will make a significant difference with respect to protecting against current leakage for an N-channel transistor. Therefore, a voltage divider provided by negative voltage generator 17 is directed to an implementation having a voltage between zero potential (ground 21) and $V_{bb}$ 20. Resistors 23 and 24 may be selected to obtain a desired voltage within the zero to $V_{bb}$ range. Furthermore, resistors 23 and 24 may be chosen such that negative voltage generator 17 consumes very little current. In particular, resistors 23 and 24 may be selected such that voltage generator 17 consumes little more than two microamperes of current for a $V_{bb}$ of −1.2 volts for a 5 volt $V_{cc}$ 22 supply.

With continuing reference to FIG. 3, operation of negative voltage translator 16 will be described. Control signal 47 is applied to node 26. For control signal 47 active high, output 6 of inverter 27 will be low. As voltage at node 28 is low, transistor 29 is on, transistor 31 is off, and transistor 34 is off. Notably, the substrate of transistors 29 and 33 is biased to $V_{cc}$ 22. Because transistor 29 is on, $V_{cc}$ 22 connected to transistor 29 is conducted to node 37, which in turn turns on transistor 32 and turns off transistor 33. With transistor 32 on, voltage at node 25 is supplied to node 38. As control signal 47 is active high, transistor 36 is on, allowing voltage from node 38 to be conducted to node 39.

Alternatively, if signal 47 is inactive low, output of inverter 27 is high, causing transistor 29 to turn off, and transistors 31 and 34 to turn on. Transistor 31 being on will allow negative voltage at node 25 to be conducted to node 37, causing transistor 32 to be turned off and causing transistor 33 to be turned on. Because transistors 33 and 34 are on, node 38 is conducted to ground 21. By grounding nodes 38 and 26, which prevents transistor 36 from turning on, negative voltage translator 16 is electrically isolated from MUX 70 (shown in FIG. 2).

Figure 5:
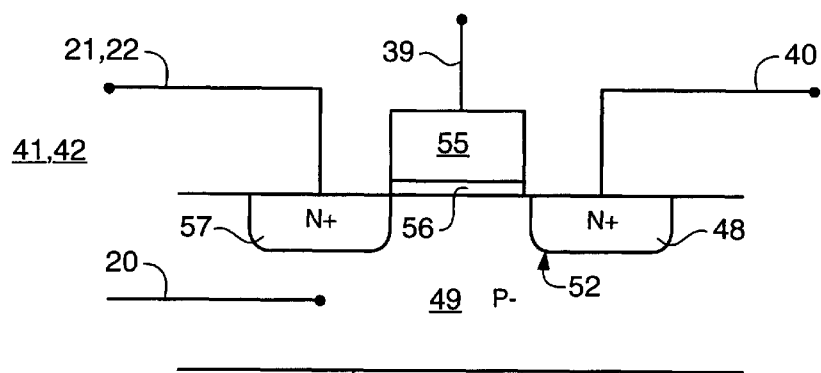
FIG. 5 is a cross-section of an exemplary portion of an output driver in accordance with the present invention.

Referring now to FIG. 5, there is shown a cross-section of an exemplary portion of an N-channel enhancement mode transistor 41 or 42 in accordance with an embodiment of the present invention. Transistors 41, 42 include gate 55, dielectric 56, and source/drain n-plus regions 48, 57 and p-minus region 49 of substrate member 58. Again, it should be mentioned that P-channel and other transistors may be employed as well, including but not limited to depletion mode transistors. When control signal 47 (shown in FIG. 3) is active high, voltage at node 39 is set somewhere between $V_{bb}$ 20 and ground 21 potential. This negative voltage appearing at node 39 when applied to gate 55 reduces leakage current as explained elsewhere herein. Furthermore, a feedback feature of the present invention may be used to tune voltage at node 39 to reduce output leaking when DQ 11 is driven to a voltage such that a leakage path forms. For example, with respect to pull-up transistor 42, when voltage at node 40 is driven negative enough to turn on transistor 42, a leakage current will result from region 48 to region 57. In other words, if voltage at node 40 is driven at least one $V_t$ (threshold voltage) lower than a voltage at gate 55, a leakage current will result. Moreover, if a negative voltage on node 40 goes at least one $V_t$ below $V_{bb}$20, then a diode junction 52 formed by p-minus region 49 (p-type dopants of semiconductor substrate member 58) and n-plus region 48 (n-type dopants of semiconductor substrate member 58) will turn on (become reversed biased) pulling $V_{bb}$ 20 more negative. In other words, a substrate current will flow from substrate member 58 to node 40. Consequently, voltage on node 25 (shown in FIG. 3) will be decreased, resulting in voltage on node 39 being pulled more negative, provided transistor 36 (also shown in FIG. 3) is turned on. By pulling voltage on node 39 more negative, transistor 42 will be shut off. In other words, by pulling node 39 more negative, leakage current from $V_{cc}$ 22 through transistor 42 to node 40 is reduced. The same principle applies for pull-down transistor 41.

Figure 6:
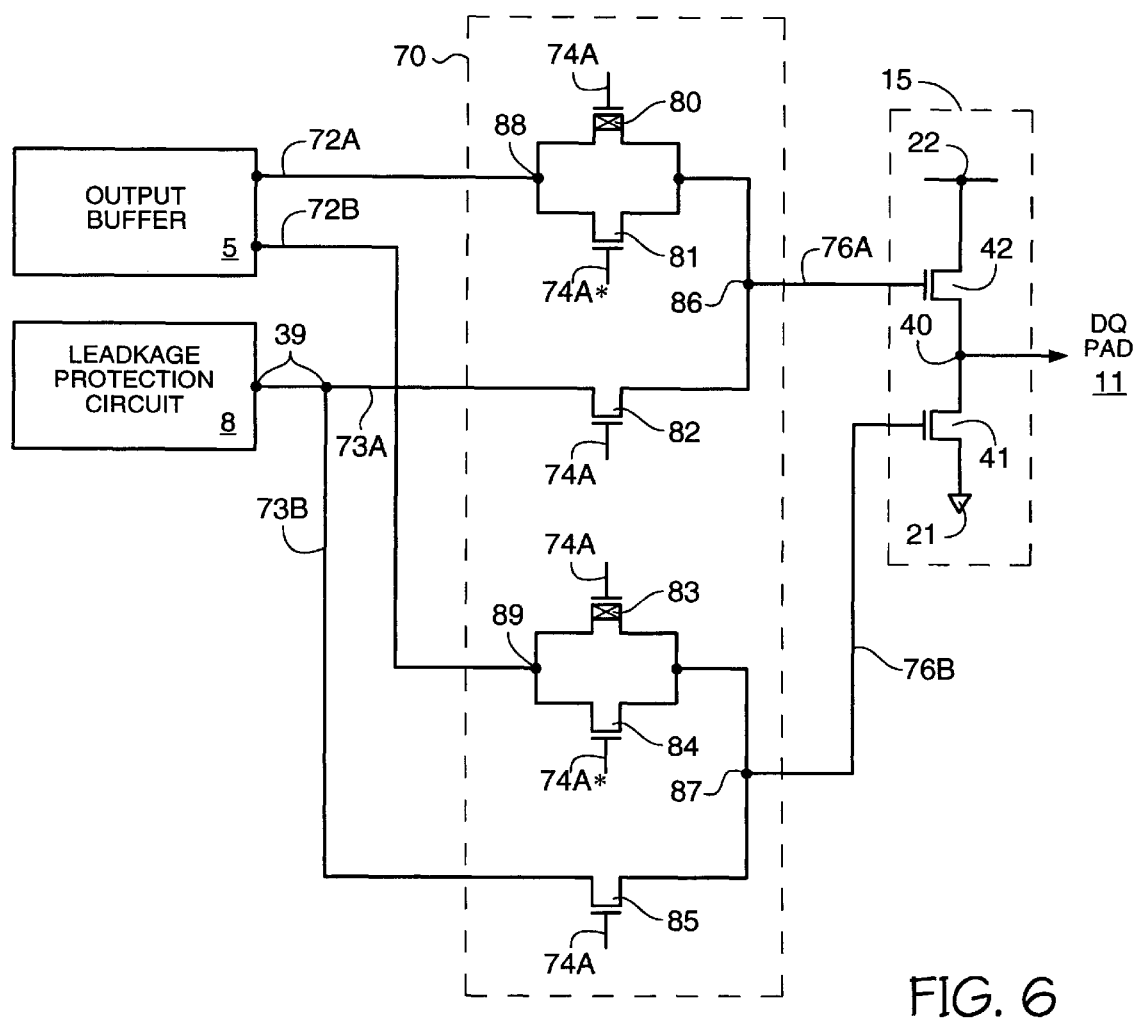
FIG. 6 is a block/circuit diagram illustrating an exemplary portion of an embodiment of the read path of FIG. 2 in accordance with the present invention.

Referring now to FIG. 6, there is shown a block/circuit diagram of an exemplary portion of an embodiment of read path 12 (shown in FIG. 2) in accordance with the present invention. When active, output buffer 5 provides data to be transferred along paths 72A and 72B depending on whether logic 1 or 0 is to be outputted, respectively. For buffer 5 active and outputting a logic 1 along path 72A, it is received to MUX 70 by transistors 80 and 81 at node 88. Signal 74A and its compliment, signal 74A* are provided from MUX control 71 (shown in FIG. 2) and may be generated in a manner similar to that of control signal 47 (shown in FIG. 4). For signal 74A logic low (thus signal 74A* is logic high), transistors 80, 81 allow output from buffer 5 to pass to node 86 from node 88. This output is passed along path 76A to pull-up transistor 42 of output driver 15. Applying a logic 1 to gate 55 (shown in FIG. 5) of transistor 42 turns on that transistor allowing $V_{cc}$ 22 to be conducted to node 40 and outputted to DQ pad 11. The same logic holds true when a logic zero (low) is to be outputted at node 40, a logic 1 is passed along path 72B to node 89 and through transistors 83, 84 to node 87. Logic 1 applied on path 76B to gate 55 (shown in FIG. 5) of transistor 41 causes transistor 41 to turn on. With transistor 41 turned on, node 40 is pulled down to common ground 21, and thus a logic 0 may be outputted to DQ pad 11.

Notably, for output buffer 5 active, signal 74A is low. For signal 74A low, transistors 82 and 85 are off. Thus, no negative voltage may be applied from leakage protection circuit 8 when output buffer 5 is active. When output buffer 5 is inactive, signal 74A is high. Consequently, signal 74A* is low, and transistors 80, 81, 83, 84 are all off. With signal 74A high, a negative voltage appearing at node 39 and applied to paths 73A and 73B is conducted to nodes 86 and 87 through transistors 82 and 85, respectively. Thus, a negative voltage may be applied from nodes 86 and 87 to gates 55 of transistors 42 and 41, respectively, for reducing leakage current across those devices.

Figure 7:
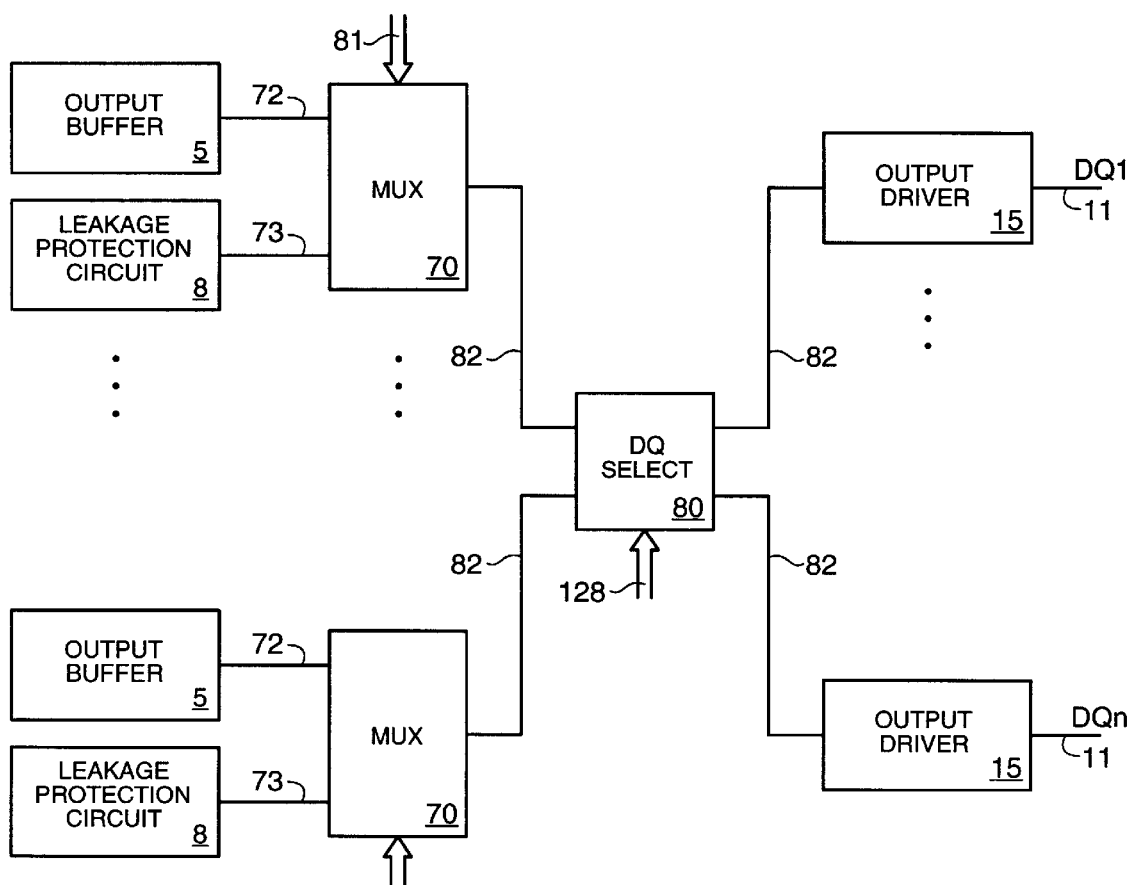
FIG. 7 is a block diagram illustrating an alternate embodiment of an exemplary portion of a read path in accordance with the present invention.

Referring to FIG. 7, there is shown a block diagram illustrating an alternate embodiment of an exemplary portion of a read path in accordance with the present invention. Output buffers 5 and leakage protection circuits 8 are coupled to MUXs 70 via pathways 72 and 73, respectively. Select signal(s) 81 selects either input, from buffer 5 or circuit 8 depending on modes of (DRAM) operation, for output to pathways 82. DQ select 80 may be a MUX receiving select signals(s) 128. Such signal(s) 128 may be provided to DQ select 80 for selecting a particular DQ or multiple DQs. DQ select 80 is optional, and thus pathways 82 may be directly supplied to output drivers 15. Output driver 15 is associated with a DQ pad 11, namely, DQ1 through to DQn for n, a positive integer.

Figure 8:
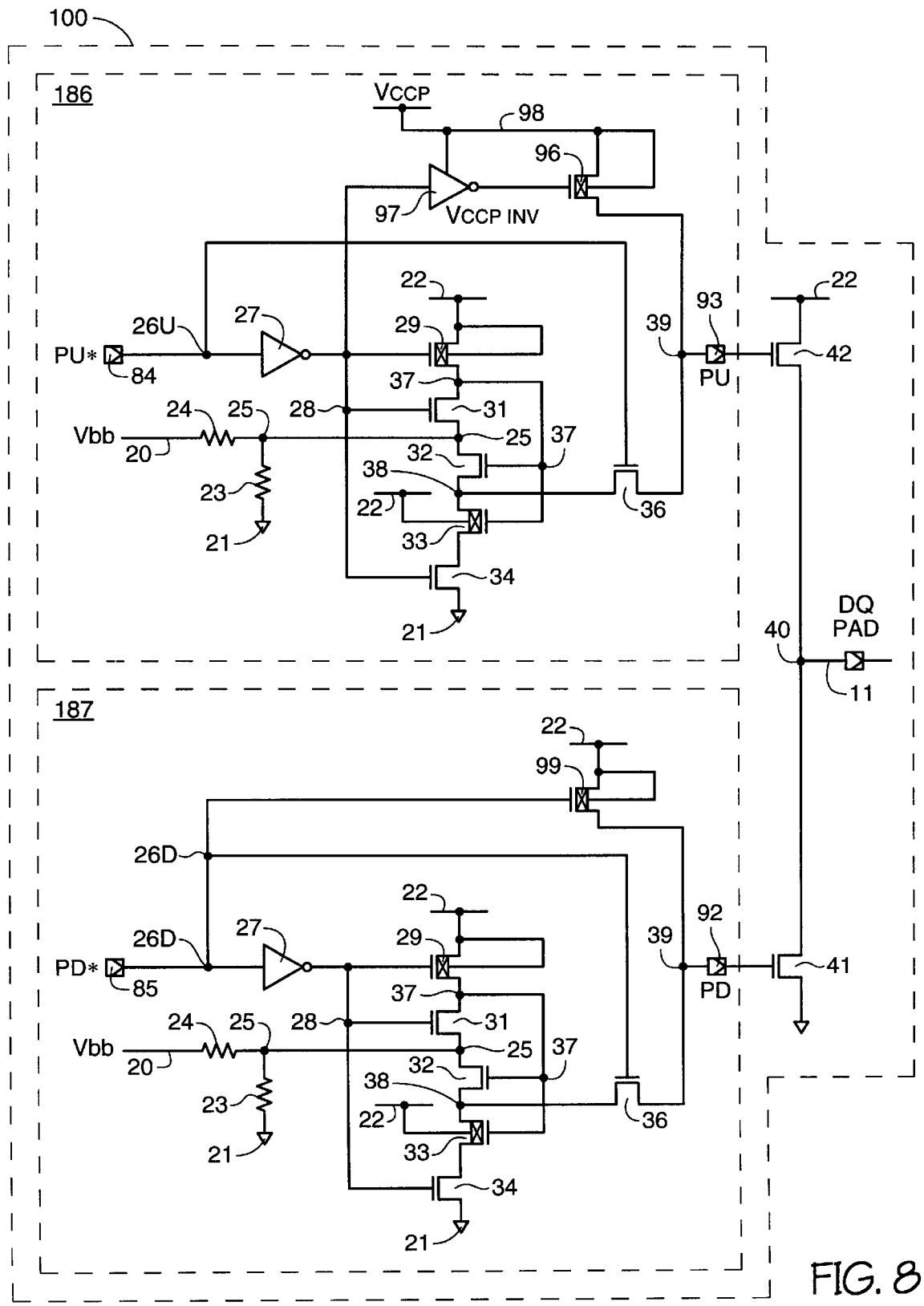
FIG. 8 is a schematic diagram of an embodiment of a leakage protection device in accordance with the present invention.
Figure 9A:
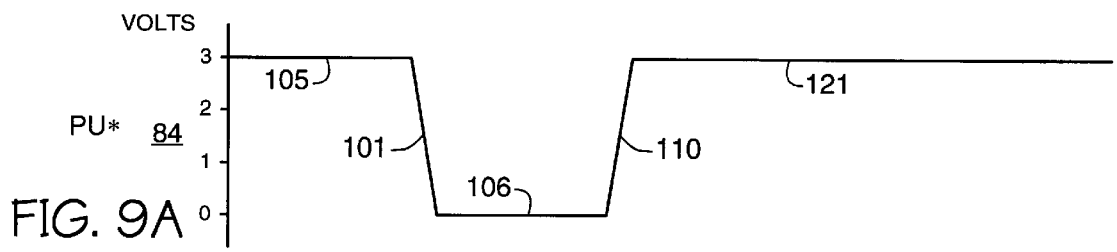
FIG. 9 is a signal simulation plot for the circuit of FIG. 8.
Figure 9B:
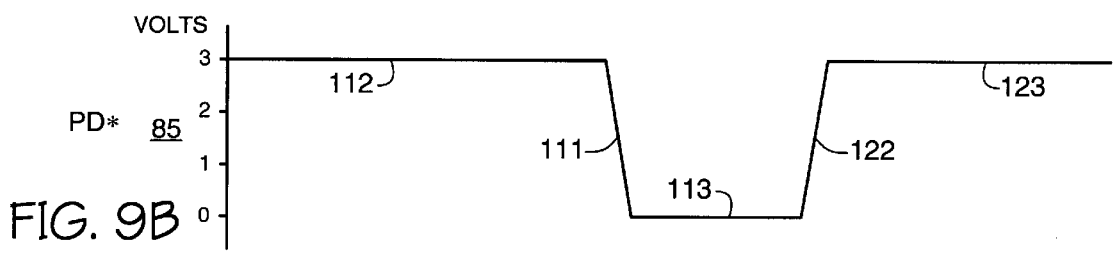
Figure 9C:
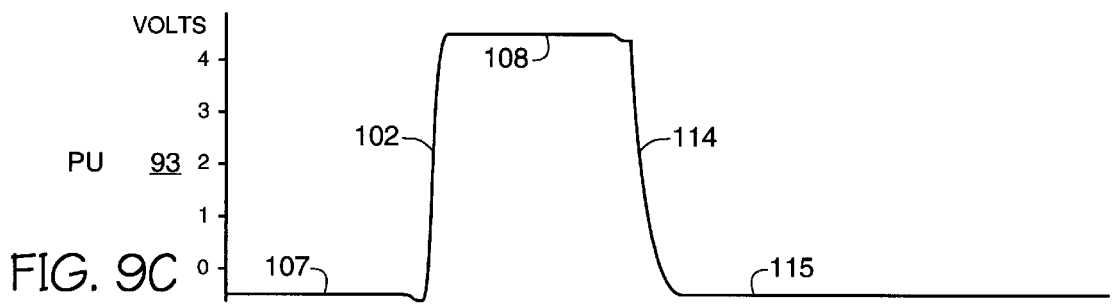
Figure 9D:
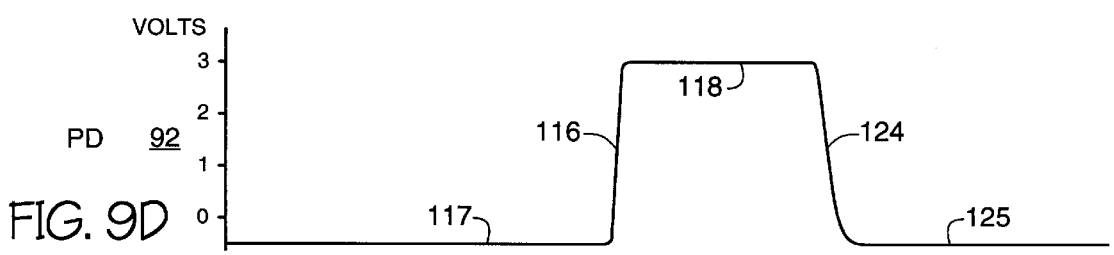
Figure 9E:
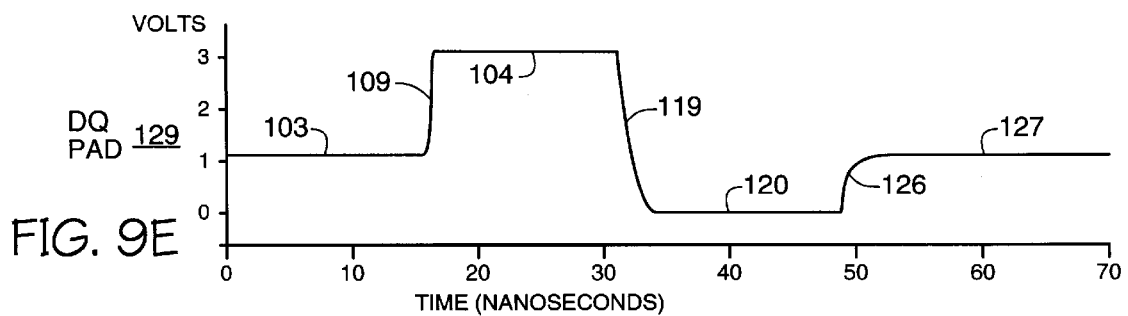

Referring now to FIG. 8, there is shown a schematic diagram of an embodiment of a leakage protection device 100 in accordance with the present invention. Device 100 is a preferred embodiment. Pull-up (PU*) signal 84 is active low, so to is pull-down (PD*) signal 85. Signals 84, 85 are applied to nodes 26U, 26D, respectively. Device 100 is similar to circuit 8 in combination with driver 15 of FIG. 3, but with some changes.

Inverter 97 is connected to node 28 of pull-up section 186. For PU* signal 84 inactive, input to inverter 97 is logic low. Consequently, output from inverter 97 to transistor 96 is logic high. This prevents transistor 96 from turning on. However, transistor 36 receives a logic high signal from PU* signal 84, and thus turns on to provide negative voltage from node 25 to pull-up transistor 42 for reducing leakage current, as explained elsewhere herein. For PU* signal 84 active, transistor 36 is off and input to inverter 97 is logic high. Hence, output from inverter 97 to transistor 96 is logic low for turning on transistor 96. VCCP (a voltage typically greater than $V_{cc}$ 22) 98 conducts across transistor 96 to node 39. VCCP is typically a boosted voltage. Applying VCCP 98 to node 39 causes pull-up transistor 42 to turn on, so $V_{cc}$ 22 is provided across transistor 42 to node 40 for output to DQ pad 11.

With continued reference to FIG. 8, operation of pull-down section 187 will be explained. For PD* signal 85 inactive, transistor 36 is on for providing negative voltage to node 39 and to pull-down transistor 41 for reducing leakage current, as explained elsewhere herein. In which case, transistor 99 connected to node 26D is off. For PD* signal 85 active, transistor 36 is off, and transistor 99 is on. Thus $V_{cc}$ 22 is conducted to node 39 for turning on pull-down transistor 41.

In this manner, PU* and PD* signals 84, 85 as provided to pull-up and pull-down sections 186, 187, respectively, may be used for controlling operation of device 100. Pull-up and pull-down sections 186, 187 are each leakage protection circuits similar to leakage protection circuit 8.

Referring now to FIG. 9, there is shown signal simulation plot for signals 84, 85, 93, 92 of FIG. 8. For PU* signal 84 transitioning 101 from inactive logic high 105 to active logic low 106, PU signal 93 transitions 102 from logic low 107 to logic high 108 and output on DQ pad 11, namely output signal 129, transitions 109 from tristate voltage 103 to logic high voltage 104. When PU* signal 84 transitions from logic low 106 to logic high 121 and PD* signal 85 transitions 111 from logic high 112 to logic low 113: PU signal 93 transitions 114 to logic low 115, PD signal 92 transitions 116 from logic low 117 to logic high 118, and output signal 129 transitions 119 from logic high 104 to logic low 120. When PD* signal 85 transitions 122 from logic low 113 to logic high 123, PD signal 92 transitions 124 from logic high 118 to logic low 125, and output signal 129 transitions 126 from logic low 120 to tristate voltage 127.

Figure 10:
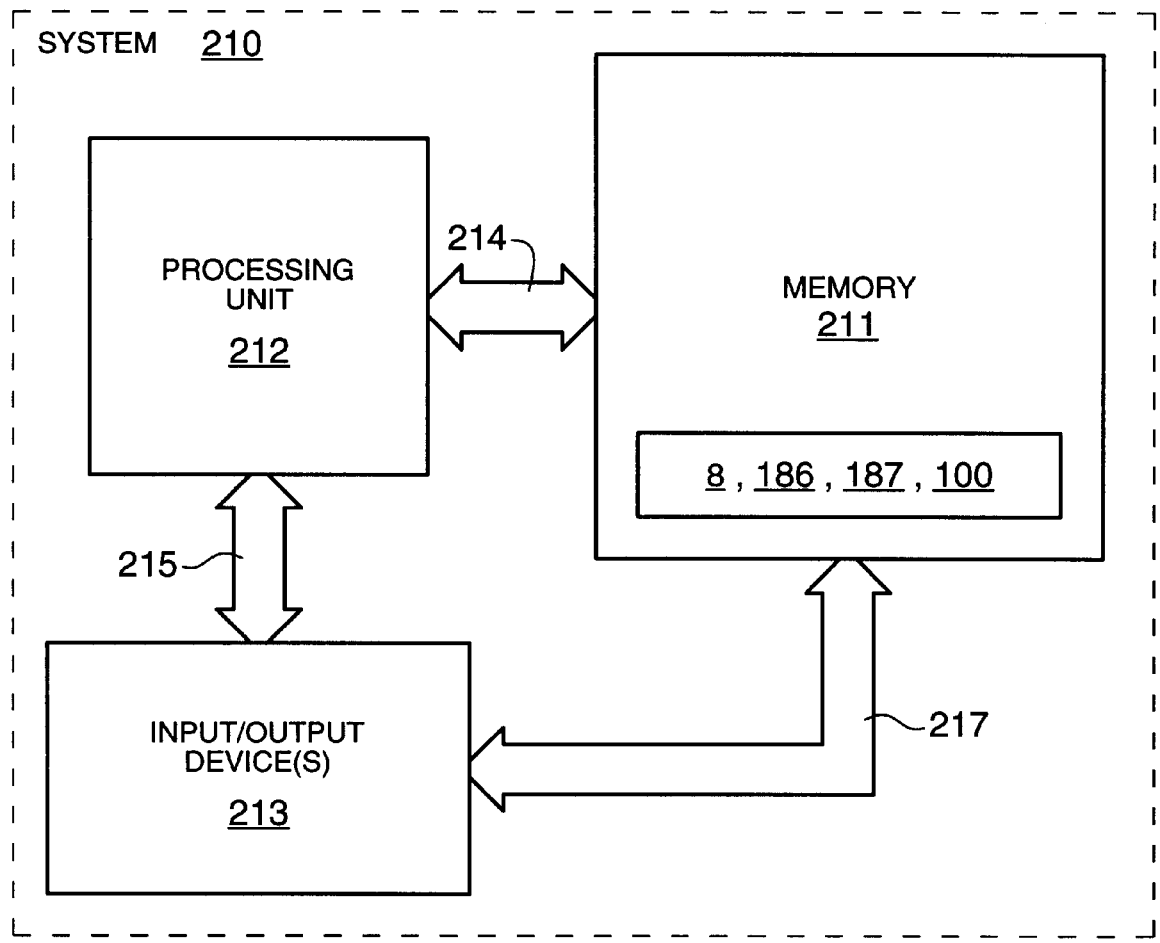
FIG. 10 is a block diagram of an exemplary portion of a system having a memory incorporating leakage protection in accordance with the present invention.

Referring to FIG. 10, there is a block diagram having leakage protection circuits 8, 186, 187 or device 100 in memory 211 of information handling system 210 in accordance with the present invention. System 210 comprises processing unit 212 and input/output device(s) 213. Pathways 214, 215, 217 may be employed for providing information to and from processing unit 212, input/output device (s) 213, and memory 211.

Although an embodiment of the present invention has been described in terms of a DRAM, it should be understood that leakage protection circuits 8, 186, 187 and device 100 may be adapted for use with a variety of integrated circuitry. For example, such circuitry includes memories, microprocessors, microcontrollers, digital signal processors, application-specific integrated circuits, programmable logic devices, and like devices employing transistors having sub-threshold voltage current leakage. While the present invention has been described with respect to a DRAM, other memories such as read only memories, flash memories and other types of random access memories may be employed in accordance with the present invention. It will further be apparent to those skilled in the art that the embodiments of the present invention disclosed in detail herein may be modified in numerous ways and may assume many embodiments other than those specifically set out herein. Moreover, it will be appreciated that leakage protection circuit 8 and device 100 may be employed in circuits in a variety of information handling systems. Such systems may include, but are not limited to, memory modules, network cards, telephones, scanners, facsimile machines, network routers, copy machines, displays, printers, calculators, computers, and recorders, among other systems. Therefore, although the present invention has been particularly shown and described with respect to certain preferred embodiments and features thereof, it should be readily apparent to those of ordinary skill in the art that various changes and modifications in form and detail may be made without departing from the spirit and the scope of the present invention as set forth in the appended claims.

What is claimed is:

1. A memory device comprising:
   an array of memory cells; and
   a read path operatively coupled to the array of memory cells, the read path comprising:
   a leakage blocking circuit;
   an output driver operatively coupled to the leakage blocking circuit; and
   the leakage blocking circuit having a voltage generator configured to provide a leakage blocking polarity voltage to the output driver the voltage generator coupled to a voltage biased substrate member of the output driver.

2. A memory device comprising:
   an array of memory cells; and
   a read path operatively coupled to the array of memory cells, the read path comprising:
   a leakage blocking circuit;
   an output driver operatively coupled to the leakage blocking circuit;
   the leakage blocking circuit having a voltage generator configured to provide a leakage blocking polarity voltage to the output driver, the voltage generator coupled to a voltage biased substrate member of the output driver; and
   the voltage generator including a voltage divider circuit configured to provide the leakage blocking polarity voltage in a range between about zero volts and a voltage level of the voltage biased substrate member.

3. A memory device comprising:
   an array of memory cells; and
   a read path operatively coupled to the array of memory cells, the read path comprising:
   a leakage blocking circuit;
   an output driver operatively coupled to the leakage blocking circuit;
   the leakage blocking circuit having a voltage generator configured to provide a leakage blocking polarity voltage to the output driver, the voltage generator coupled to a voltage biased substrate member of the output driver; and
   the voltage generator comprising a voltage divider circuit configured to provide the voltage in a range between about zero volts and a negative voltage.

4. A system comprising:
   a processing unit;
   input/output devices in electrical communication with the processing unit;
   at least one memory in electrical communication with the processing unit and the input/output devices and operatively coupled to store and retrieve information;
   the memory comprising an array of memory cells and a read path which includes an output driver having at least one transistor device operatively coupled to selectively receive at least a portion of a substrate bias voltage as a gating voltage; and
   the transistor device connected to an output node of the output driver, the output node operatively coupled to the substrate bias voltage through the transistor device to provide a feedback path to a gate of the transistor device to supply the gating voltage thereto.

5. A system comprising:
   a processing unit;
   input/output devices in electrical communication with the processing unit;
   at least one memory in electrical communication with the processing unit and the input/output devices and operatively coupled to store and retrieve information;
   the memory comprising an array of memory cells and a read path which includes an output driver having at least one transistor device operatively coupled to selectively receive at least a portion of a substrate bias voltage as a gating voltage;
   the transistor device connected to an output node of the output driver, the output node operatively coupled to the substrate bias voltage through the transistor device to provide a feedback path to a gate of the transistor device to supply the gating voltage thereto; and
   the feedback path configured to operatively couple the substrate bias voltage to an output pad voltage in response to the output pad voltage overcoming a barrier potential of the transistor device.

6. A circuit for a memory, the circuit comprising:
   an output driver;
   a voltage generator;
   a controller configured to apply a blocking polarity potential from the voltage generator to the output driver during inactive periods of the output driver and to prevent application of the blocking polarity potential during active periods of the output driver; and
   the output driver including a junction formed by different semiconductor dopants to provide a voltage barrier.

7. A circuit for a memory, the circuit comprising:
   an output driver;
   a voltage generator;
   a controller configured to apply a blocking polarity potential from the voltage generator to the output driver during inactive periods of the output driver and to prevent application of the blocking polarity potential during active periods of the output driver;
   the output driver including a junction formed by different semiconductor dopants to provide a voltage barrier; and
   the voltage barrier providing a conductive path to adjust the blocking polarity potential.

* * * * *